(12) United States Patent
Ngo et al.

(10) Patent No.: US 6,482,755 B1
(45) Date of Patent: Nov. 19, 2002

(54) HDP DEPOSITION HILLOCK SUPPRESSION METHOD IN INTEGRATED CIRCUITS

(75) Inventors: Minh Van Ngo, Fremont, CA (US); Dawn M. Hopper, San Jose, CA (US); Robert A. Huertas, Hollister, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/880,513

(22) Filed: Jun. 12, 2001

Related U.S. Application Data
(60) Provisional application No. 60/245,691, filed on Nov. 2, 2000.

(51) Int. Cl.[7] .............................................. H01L 21/31
(52) U.S. Cl. ..................... 438/792; 438/622; 438/628; 438/644; 438/687
(58) Field of Search ................................. 438/618, 622, 438/626, 628, 629, 633, 637, 642, 643, 644, 687, 791, 792

(56) References Cited

U.S. PATENT DOCUMENTS

| | | | |
|---|---|---|---|
| 5,151,168 A | * | 9/1992 | Gilton et al. ................ 205/123 |
| 5,447,887 A | * | 9/1995 | Filipiak et al. .............. 438/644 |
| 6,225,211 B1 | * | 5/2001 | Tsui ............................ 438/624 |
| 6,368,988 B1 | * | 4/2002 | Li et al. ...................... 438/294 |

\* cited by examiner

*Primary Examiner*—Eddie Lee
*Assistant Examiner*—N. Drew Richards
(74) *Attorney, Agent, or Firm*—Mikio Ishimaru

(57) ABSTRACT

An integrated circuit and manufacturing method therefor is provided having a semiconductor substrate with a semiconductor device. A dielectric layer is formed over the semiconductor substrate has an opening formed therein. A barrier layer of titanium, tantalum, tungsten, or a nitride of the aforegoing lines the opening, and a copper or copper alloy conductor core fills the channel opening over the barrier layer. After planarization of the conductor core and the barrier layer, an ammonia, nitrogen hydride, or hydrogen plasma treatment is performed below 300° C. and above 3000 watts source power to reduce the residual oxide on the conductor core material. A silicon nitride capping layer is deposited by high density plasma (HDP) deposition with the source power between 2250 and 2750 watts and the bias power between 1800 and 2200 watts to suppress the formation of hillocks.

18 Claims, 2 Drawing Sheets

HDP DEPOSITION HILLOCK SUPPRESSION METHOD IN INTEGRATED CIRCUITS

CROSS-REFERENCE TO RELATED APPLICATION(S)

This application claims the benefit of U.S. Provisional patent application Ser. No. 60/245,691 filed Nov. 2, 2000.

The present application also contains subject matter related to a copending U.S. Patent Application by Minh Van Ngo and Christy Mei-Chu Woo entitled "DENSIFICATION PROCESS HILLOCK SUPPRESSION METHOD IN INTEGRATED CIRCUITS" and identified by Ser. No. 09/705,444.

TECHNICAL FIELD

The present invention relates generally to semiconductor technology and more specifically to suppressing hillocks in copper interconnects in semiconductor processing.

BACKGROUND ART

In the manufacture of integrated circuits, after the individual devices such as the transistors have been fabricated in and on the semiconductor substrate, they must be connected together to perform the desired circuit functions. This interconnection process is generally called "metallization" and is performed using a number of different photolithographic, deposition, and removal techniques.

In one interconnection process, which is called a "dual damascene" technique, two channels of conductor materials are separated by interlayer dielectric layers in vertically separated planes perpendicular to each other and interconnected by a vertical connection, or "via", at their closest point. The dual damascene technique is performed over the individual devices which are in a device dielectric layer with the gate and source/drain contacts, extending up through the device dielectric layer to contact one or more channels in a first channel dielectric layer.

The first channel formation of the dual damascene process starts with the deposition of a thin first channel stop layer. The first channel stop layer is an etch stop layer which is subject to a photolithographic processing step which involves deposition, patterning, exposure, and development of a photoresist, and an anisotropic etching step through the patterned photoresist to provide openings to the device contacts. The photoresist is then stripped. A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched.

The first channel dielectric layer is then subject to further photolithographic process and etching steps to form first channel openings in the pattern of the first channels. The photoresist is then stripped.

An optional thin adhesion layer is deposited on the first channel dielectric layer and lines the first channel openings to ensure good adhesion of subsequently deposited material to the first channel dielectric layer. Adhesion layers for copper (Cu) conductor materials are composed of compounds such as tantalum nitride (TaN), titanium nitride (TiN), or tungsten nitride (WN).

These nitride compounds have good adhesion to the dielectric materials and provide good barrier resistance to the diffusion of copper from the copper conductor materials to the dielectric material. High barrier resistance is necessary with conductor materials such as copper to prevent diffusion of subsequently deposited copper into the dielectric layer, which can cause short circuits in the integrated circuit.

However, these nitride compounds also have relatively poor adhesion to copper and relatively high electrical resistance.

Because of the drawbacks, pure refractory metals such as tantalum (Ta), titanium (Ti), or tungsten (W) are deposited on the adhesion layer to line the adhesion layer in the first channel openings. The refractory metals are good barrier materials, have lower electrical resistance than their nitrides, and have good adhesion to copper.

In some cases, the barrier material has sufficient adhesion to the dielectric material that the adhesion layer is not required, and in other cases, the adhesion and barrier material become integral. The adhesion and barrier layers are often collectively referred to as a "barrier" layer herein.

For conductor materials such as copper, which are deposited by electroplating, a seed layer is deposited on the barrier layer and lines the barrier layer in the first channel openings. The seed layer, generally of copper, is deposited to act as an electrode for the electroplating process.

A first conductor material is deposited on the seed layer and fills the first channel opening. The first conductor material and the seed layer generally become integral, and are often collectively referred to as the conductor core when discussing the main current-carrying portion of the channels.

A chemical-mechanical polishing (CMP) process is then used to remove the first conductor material, the seed layer, and the barrier layer above the first channel dielectric layer to form the first channels. When a layer is placed over the first channels as a final layer, it is called a "capping" layer and the "single" damascene process is completed. When additional layers of material are to be deposited for the dual damascene process, the capping layer also functions as an etch stop layer for a via formation step.

The via formation step of the dual damascene process continues with the deposition of a via dielectric layer over the first channels, the first channel dielectric layer, and the capping or via stop layer. The via stop layer is an etch stop layer which is subject to photolithographic processing and anisotropic etching steps to provide openings to the first channels. The photoresist is then stripped.

A via dielectric layer is formed on the via stop layer. Again, where the via dielectric layer is of an oxide material, such as silicon oxide, the via stop layer is a nitride, such as silicon nitride, so the two layers can be selectively etched. The via dielectric layer is then subject to further photolithographic process and etching steps to form the pattern of the vias. The photoresist is then stripped.

A second channel dielectric layer is formed on the via dielectric layer. Again, where the second channel dielectric layer is of an oxide material, such as silicon oxide, the via stop layer is a nitride, such as silicon nitride, so the two layers can be selectively etched. The second channel dielectric layer is then subject to further photolithographic process and etching steps to simultaneously form second channel and via openings in the pattern of the second channels and the vias. The photoresist is then stripped.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, which are deposited by electroplating, a seed layer is deposited by electro-less deposition on the barrier layer and lines the barrier layer in the second channel openings and the vias.

A second conductor material is deposited on the seed layer and fills the second channel openings and the vias.

A CMP process is then used to remove the second conductor material, the seed layer, and the barrier layer above the second channel dielectric layer to simultaneously form the vias and the second channels. When a layer is placed over the second channels as a final layer, it is called a "capping" layer and the "dual" damascene process is completed.

Individual and multiple levels of single and dual damascene structures can be formed for single and multiple levels of channels and vias, which are collectively referred to as "interconnects".

The use of the single and dual damascene techniques eliminates metal etch and dielectric gap fill steps typically used in the metallization process. The elimination of metal etch steps is important as the semiconductor industry moves from aluminum (Al) to other metallization materials, such as copper, which are very difficult to etch.

One major problem relates to the formation of hillocks, or copper leakage lines, during the formation of capping layers over exposed copper conductor materials. The hillocks, which can extend into both the capping layer and the dielectric layer, are capable of causing short circuits either immediately or over time, which will irrevocably damage the integrated circuit.

Solutions to this problem have been long sought but have long eluded those skilled in the art.

DISCLOSURE OF THE INVENTION

The present invention provides a method for manufacturing an integrated circuit having a semiconductor substrate with a semiconductor device. A dielectric layer is formed on the semiconductor substrate and an opening is formed in the dielectric layer. A barrier layer is deposited to line the opening, and a conductor core is deposited to fill the channel opening over the barrier layer. After planarization of the conductor core and the barrier layer, a reducing plasma treatment is performed below 300° C. and above 3000 watts source power to reduce the residual oxidants on the conductor core material. The plasma treatment is followed by the deposition of a capping layer by high density plasma (HDP) deposition with the source power between 2250 and 2750 watts and the bias power between 1800 and 2200 watts to suppress the formation of hillocks.

The present invention further provides a method for manufacturing an integrated circuit having a semiconductor substrate with a semiconductor device. A dielectric layer is formed on the semiconductor substrate and an opening is formed in the dielectric layer. A barrier layer of titanium, tantalum, tungsten, or a nitride of the aforegoing is deposited to line the opening, and a copper or copper alloy conductor core is deposited to fill the channel opening over the barrier layer. After planarization of the conductor core and the barrier layer, an ammonia, nitrogen hydride, or hydrogen plasma treatment is performed below 300° C. and above 3000 watts source power to reduce the residual oxide on the conductor core material. The plasma treatment is followed by the deposition of a silicon nitride capping layer by high density plasma (HDP) deposition with the source power between 2250 and 2750 watts and the bias power between 1800 and 2200 watts to suppress the formation of hillocks.

At the lower temperatures of plasma treatment and deposition, the by-product hydrogen ($H_2$) inside the deposition chamber is reduced. A reduced quantity of hydrogen suppresses the propensity of copper to form hillocks.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
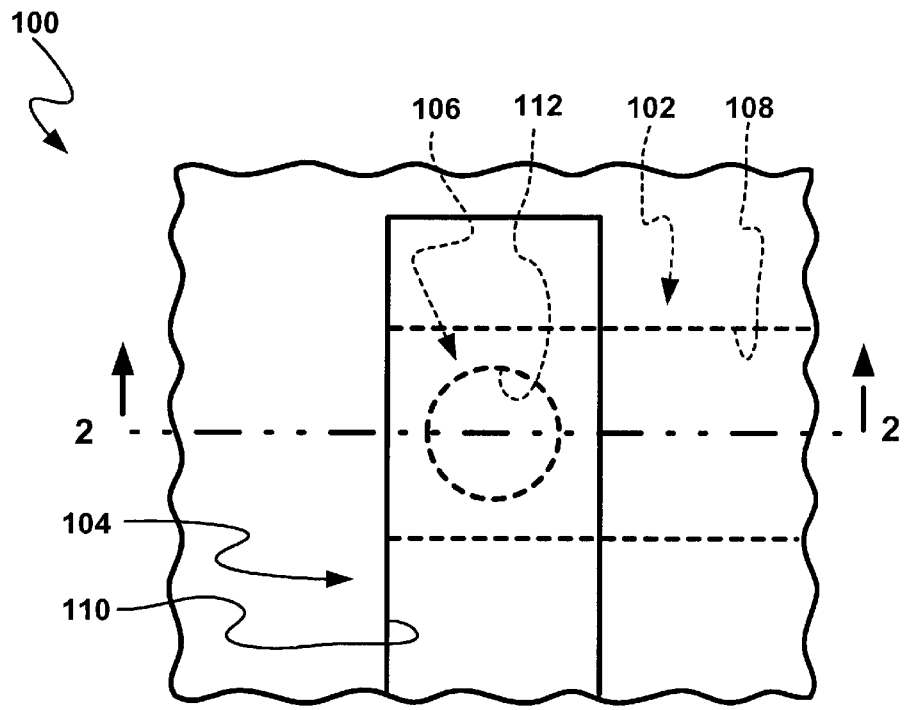
FIG. 1 (PRIOR ART) is a plan view of aligned channels with a connecting via.

Referring now to FIG. 1 (PRIOR ART), therein is shown a plan view of a semiconductor wafer 100 having as interconnects first and second channels 102 and 104 connected by a via 106. The first and second channels 102 and 104 are respectively disposed in first and second channel dielectric layers 108 and 110. The via 106 is an integral part of the second channel 104 and is disposed in a via dielectric layer 112.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
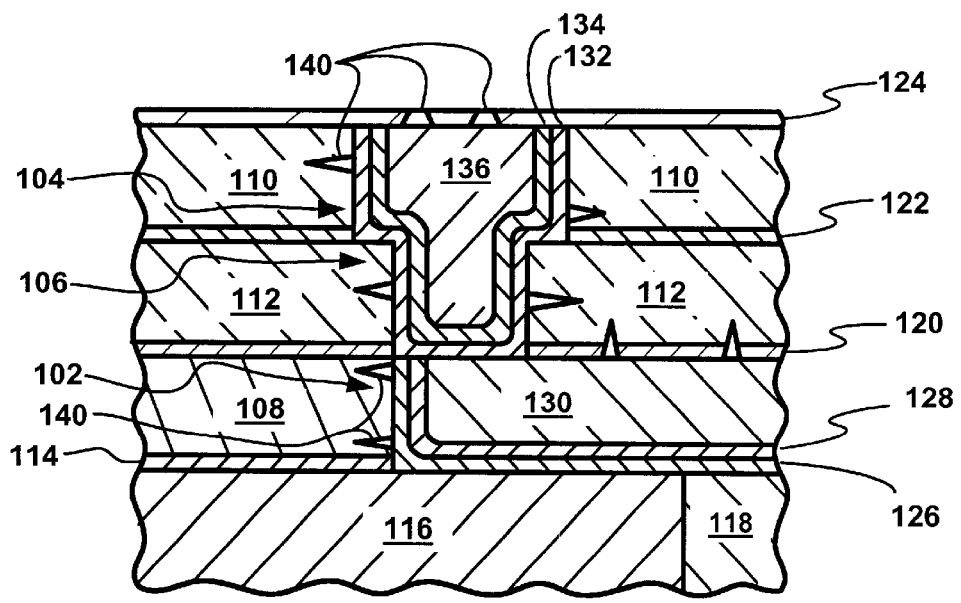
FIG. 2 (PRIOR ART) is a cross-section of FIG. 1 (PRIOR ART) along line 2—2 showing hillocks.

Referring now to FIG. 2 (PRIOR ART), therein is shown a cross-section of FIG. 1 (PRIOR ART) along line 2—2. A portion of the first channel 102 is disposed in a first channel stop layer 114 and is on a device dielectric layer 116. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a capping layer 120, the via dielectric layer 112, a second channel stop layer 122, the second channel dielectric layer 110, and a next capping layer 124 (not shown in FIG. 1).

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device.

The seed layers 128 and 134 form electrodes on which the conductor material of the conductor cores 130 and 136 are deposited. The seed layers 128 and 134 are of substantially the same conductor material as the conductor cores 130 and 136 and become part of the respective conductor cores 130 and 136 after the deposition.

In the single and dual damascene processes, after formation of the first and second channels 102 and 104, respectively, the exposed conductor material 130 and 136 must be reduced and capped by the respective capping layers 120 and 124.

With copper conductor materials, the capping layers 120 and 124 are formed by a process that first uses an ammonia plasma treatment at 400° C. to reduce any residual copper oxide, which may be present on the upper surfaces of the first and second channels 102 and 104. This is followed by a silicon nitride deposition plasma enhanced chemical vapor deposition (PECVD) at 400° C. to provide the capping layers 120 and 124, which may be up to 500 Å in thickness.

It has been discovered that the 400° C. ammonia plasma treatment causes the formation of small stress fractures in the first and second channel dielectric layers 108 and 110, which allow the diffusion of copper to form hillocks 140, which are leakage lines of copper into the dielectric material.

It has also been found that the PECVD deposition at 400° C. also develops stress fractures in the capping layers 120 and 124, which create hillocks, which extend through the capping layers 120 and 124.

It has been believed to be necessary that in order to obtain proper reduction of copper oxide and proper deposition of the silicon nitride, temperatures above 400° C. were required.

Figure 3:
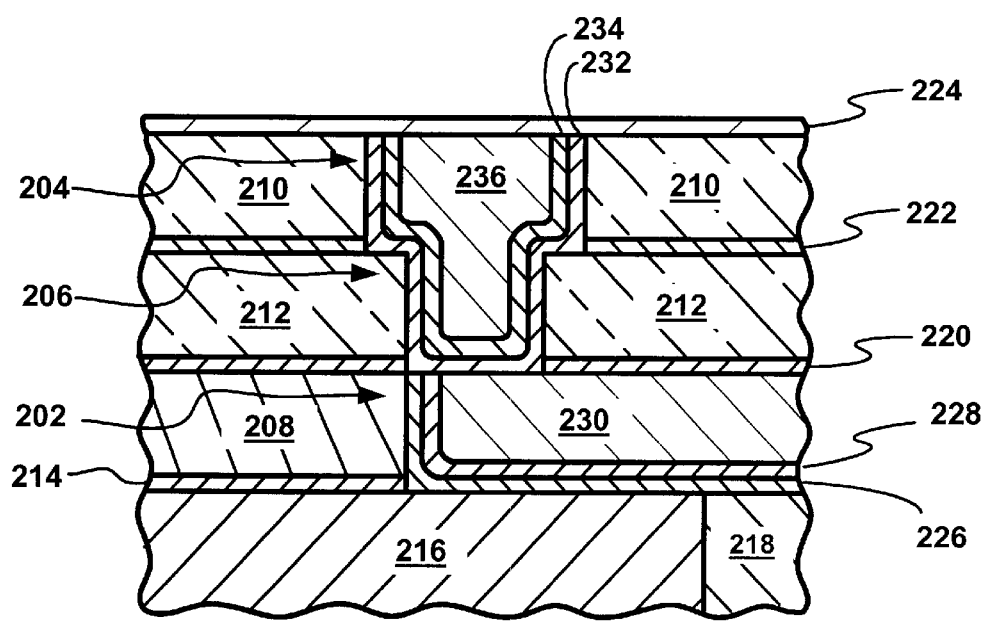
FIG. 3 is a cross-section of a semiconductor interconnect where the hillocks are suppressed in accordance with the present invention.

Referring now to FIG. 3, therein is shown a cross-section similar to that shown in FIG. 2 (PRIOR ART) of a semiconductor wafer 200 of the present invention. The semiconductor wafer 200 has first and second channels 202 and 204 connected by a via 206. The first and second channels 202 and 204 are respectively disposed in first and second channel dielectric layers 208 and 210. The via 206 is a part of the second channel 204 and is disposed in a via dielectric layer 212.

A portion of the first channel 202 is disposed in a first channel stop layer 214 and is on a device dielectric layer 216. Generally, a metal contacts are formed in the device dielectric layer 216 to connect to an operative semiconductor device (not shown). This is represented by the contact of the first channel 202 with a semiconductor contact 218 embedded in the device dielectric layer 216. The various layers above the device dielectric layer 216 are sequentially: the first channel stop layer 214, the first channel dielectric layer 208, a capping layer 220, the via dielectric layer 212, a second channel stop layer 222, the second channel dielectric layer 210, and a next capping layer 224.

The first channel 202 includes a barrier layer 226 and a seed layer 228 around a conductor core 230. The second channel 204 and the via 206 include a barrier layer 232 and a seed layer 234 around a conductor core 236. The barrier layers 226 and 232 are used to prevent diffusion of the conductor materials into the adjacent areas of the semiconductor device.

The seed layers 228 and 234 form electrodes on which the conductor material of the conductor cores 230 and 236 are deposited. The seed layers 228 and 234 are of substantially the same conductor material as the conductor cores 230 and 236 and become part of the respective conductor cores 230 and 236 after the deposition.

After analyzing the formation of the hillocks, it has been determined that the hillocks 140 are due to high stress resulting from the high temperatures used.

In the present invention, it has been discovered that it is possible to perform a reducing plasma treatment below 300° C. and above 3000 watts source power to reduce the residual oxidant on the conductor core material. For copper conductor materials, this would be an ammonia ($NH_3$), nitrogen hydride ($N_2H_2$), and/or $H_2$ plasma treatment, which will reduce any copper oxide, which is present.

A high density plasma (HDP) deposition of the capping layer is then performed.

In the best mode, the HDP deposition is performed below 350° C. with the source power between 2250 and 2750 watts and the bias power between 1800 and 2200 watts. It has been determined that such in-situ plasma treatment and SiN deposition method have suppressed hillock formation.

As shown in FIG. 3, no hillocks 140 are formed as in FIG. 2 (PRIOR ART).

In various embodiments, the barrier layers are of materials such as tantalum (Ta), titanium (Ti), tungsten (W), nitrides thereof, and combinations thereof. The seed layers are of materials such as copper (Cu), gold (Au), silver (Ag), alloys thereof and combinations thereof. The conductor cores with or without seed layers are of materials such as copper, aluminum (Al), gold, silver, alloys thereof, and combinations thereof. The dielectric layers is are of dielectric materials such as silicon oxide ($SiO_x$), borophosphosilicate (BPSG) glass, etc. or low dielectric materials such as hydrogen silsesquioxane (HSQ), benzocyclobutene (BCB), etc. with dielectric constants below 3.0. The stop layers and capping layers (where used) are of materials such as silicon nitride ($Si_xN_x$) or silicon oxynitride (SiON).

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of manufacturing an integrated circuit comprising:

providing a semiconductor substrate having a semiconductor device provided thereon;

forming a dielectric layer on the semiconductor substrate;

forming an opening in the dielectric layer;

depositing a barrier layer to line the opening;

depositing a conductor core over the barrier layer to fill the opening and connect to the semiconductor device;

planarizing the conductor core and the barrier layer to be co-planar with the dielectric layer;

treating the conductor core in a reducing ambient at a temperature below 300° C. to reduce oxidants on the conductor core; and depositing a capping layer by high density plasma deposition with a source power above 2250 watts.

2. The method of manufacturing an integrated circuit as claimed in claim 1 wherein depositing the capping layer is performed using a high density plasma deposition with the source power below 2750 watts.

3. The method of manufacturing an integrated circuit as claimed in claim 1 wherein depositing the capping layer is performed using a high density plasma deposition with the bias power above 1800 watts.

4. The method of manufacturing an integrated circuit as claimed in claim 1 wherein depositing the capping layer is performed using a high density plasma deposition with the bias power below 2200 watts.

5. The method of manufacturing an integrated circuit as claimed in claim 1 wherein depositing the capping layer is performed using a high density plasma deposition with the bias power between 1800 and 2200 watts.

6. The method of manufacturing an integrated circuit as claimed in claim 1 wherein treating the conductor core to reduce the oxidants on the conductor core is performed using a plasma in a reducing ambient selected from a group consisting of ammonia, nitrogen hydride, hydrogen and a combination thereof at above 3000 watts source power.

7. The method of manufacturing an integrated circuit as claimed in claim 1 wherein depositing the conductor core deposits a material selected from a group consisting of copper, aluminum, gold, silver, an alloy thereof, and a combination thereof.

8. The method of manufacturing an integrated circuit as claimed in claim 1 wherein depositing the barrier layer deposits a material selected from a group consisting of tantalum, titanium, tungsten, nitrides thereof, and a combination thereof.

9. The method of manufacturing an integrated circuit as claimed in claim 1 wherein depositing the capping layer deposits silicon nitride.

10. A method of manufacturing an integrated circuit comprising:

providing a silicon substrate having a semiconductor device provided thereon;

forming a device oxide layer on the semiconductor substrate;

forming a channel oxide layer;

forming a channel opening in the channel oxide layer;

depositing a barrier layer to line the channel opening;

depositing a seed layer to line the metal barrier layer;

depositing a conductor core to fill the channel opening and connect to the semiconductor device;

planarizing the conductor core, the seed layer, and the barrier layer by chemical mechanical polishing to be co-planar with the channel oxide layer;

treating the conductor core and the seed layer in a reducing ambient at a temperature below 300° C. to reduce residual oxide on the conductor core; and depositing a capping layer by high density plasma deposition with a source power above 2250 watts.

11. The method of manufacturing an integrated circuit as claimed in claim 10 wherein deposing the capping layer is performed using a high density plasma deposition with the source power below 2750 watts.

12. The method of manufacturing an integrated circuit as claimed in claim 10 wherein depositing the capping layer is performed using a high density plasma deposition with the bias power above 1800 watts.

13. The method of manufacturing an integrated circuit as claimed in claim 10 wherein depositing the capping layer is performed using a high density plasma deposition with the bias power below 2200 watts.

14. The method of manufacturing an integrated circuit as claimed in claim 10 wherein depositing the capping layer is performed using a high density plasma deposition with the bias power between 1800 and 2200 watts.

15. The method of manufacturing an integrated circuit as claimed in claim 10 wherein treating the conductor core to reduce the residual oxide on the conductor core is performed using a plasma in a reducing ambient selected from a group consisting of ammonia, nitrogen hydride, hydrogen and a combination thereof at above 3000 watts source power.

16. The method of manufacturing an integrated circuit as claimed in claim 10 wherein depositing the seed layer and conductor core deposit materials selected from a group consisting of copper, gold, silver, an alloy thereof, and a combination thereof.

17. The method of manufacturing an integrated circuit as claimed in claim 10 wherein depositing the barrier layer deposits a material selected from a group consisting of tantalum, titanium, tungsten, nitrides thereof, and a combination thereof.

18. The method of manufacturing an integrated circuit as claimed in claim 10 wherein depositing the capping layer deposits silicon nitride.

* * * * *